Figures 1, 2:
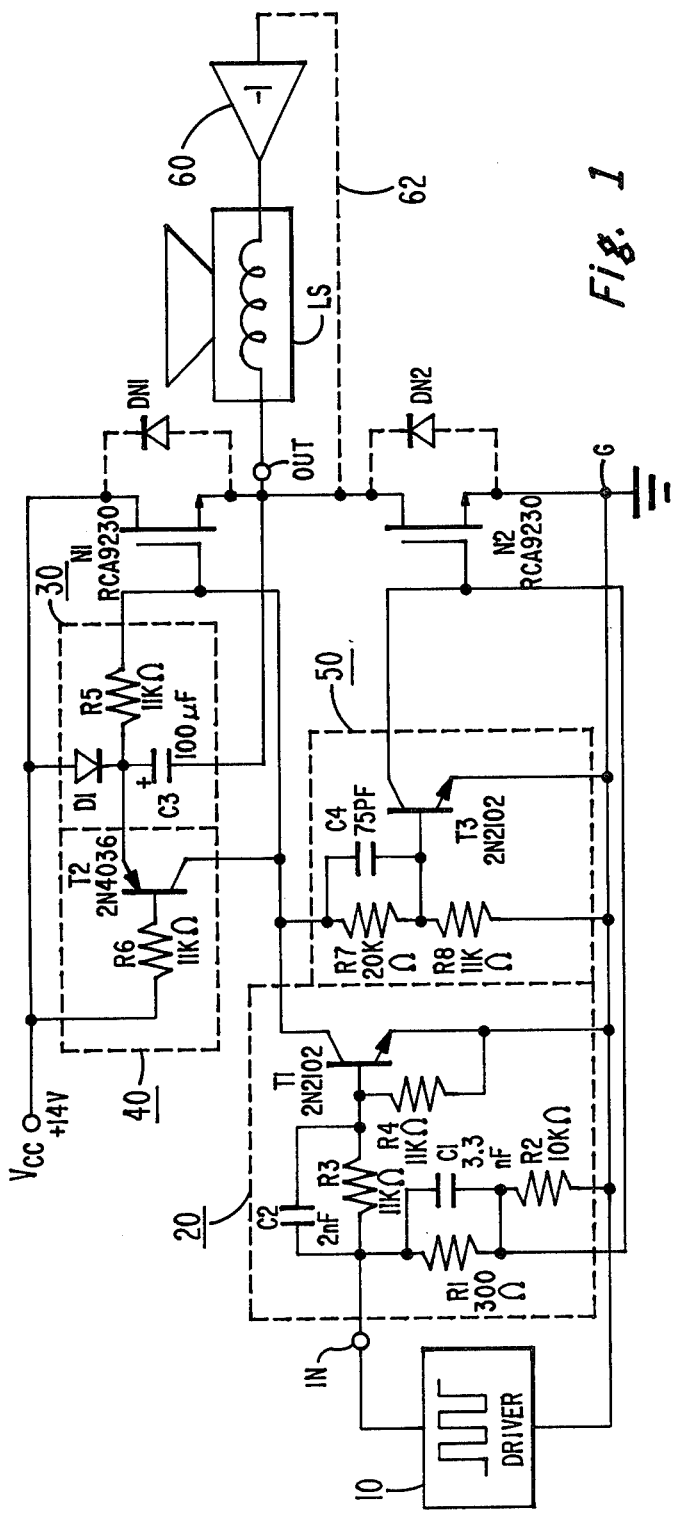

United States Patent [19]

Kaplan

[11] Patent Number: 4,463,318
[45] Date of Patent: Jul. 31, 1984

[54] POWER AMPLIFIER CIRCUIT EMPLOYING FIELD-EFFECT POWER TRANSISTORS

[75] Inventor: Leonard A. Kaplan, Fords, N.J.

[73] Assignee: RCA Corporation, New York, N.Y.

[21] Appl. No.: 412,900

[22] Filed: Aug. 30, 1982

[51] Int. Cl.³ .......................... H03F 3/217; H03F 3/26
[52] U.S. Cl. ..................................... 330/251; 330/269; 330/273
[58] Field of Search .................... 330/251, 207 A, 269, 330/277, 299, 273

[56] References Cited

U.S. PATENT DOCUMENTS

| | | | |
|---|---|---|---|
| 3,233,184 | 2/1966 | Wheatley, Jr. | 330/15 |
| 3,548,330 | 12/1970 | Rosenstein | 330/17 |
| 3,943,286 | 3/1976 | Tsurushima | 330/277 |
| 4,000,412 | 12/1976 | Rosenthal et al. | 307/208 |
| 4,041,411 | 8/1977 | Sturgeon | 330/207 A |
| 4,106,086 | 8/1978 | Holbrook et al. | 363/60 |
| 4,189,782 | 2/1980 | Dingwall | 365/190 |
| 4,219,743 | 8/1980 | Millns et al. | 307/270 |
| 4,229,667 | 10/1980 | Heimbigner et al. | 307/297 |
| 4,246,635 | 1/1981 | Arima | 363/101 |
| 4,267,465 | 5/1981 | Haug et al. | 307/238.3 |
| 4,275,437 | 6/1981 | Boll et al. | 363/60 |

OTHER PUBLICATIONS

D. Hoffman, "Driving MOSPOWER FETs", Application Note 79-4, Siliconix Inc., Jan. 1979, (reprinted in *MOSPOWER FET design catalog,* Siliconix Inc., Mar. 1982, pp. 6-21 to 6-24).
"General Design Tips-Laser Diode Pulsers", *MOSPOWER FET design catalog,* Siliconix Inc., Mar. 1982, pp. 6-67.
L. Shaeffer, "Improving Converter Performance and Operating Frequency with a New Power FET", *Proceedings of Powercon 4/Boston,* May 1977, pp. C2-1 to C2-8.
J. J. Spijkerman & C. L. Sturgeon, "The Sturgeon Amplifier—A New Switching Technique", *Proceedings of Powercon 4/Boston,* May 1977, pp. H3-1 to H3-3.
B. Harvey, "Power-FET Amplifier Designs Boost Fidelity, Reduce Complexity", *EDN,* Sep. 20, 1980, pp. 137-142.
D. Bingham, "C-MOS Makes Voltage Converter a Paragon of Efficiency", *Electronics,* Sep. 11, 1980, pp. 141-146.
J. J. Carr, "Hi-Fi Auto Audio", *ET/D,* Dec. 1980, pp. 26-29.

*Primary Examiner*—James B. Mullins
*Assistant Examiner*—G. Wan
*Attorney, Agent, or Firm*—E. M. Whitacre; P. J. Rasmussen; C. A. Berard, Jr.

[57] ABSTRACT

A class D power amplifier employing two N-channel field-effect power transistors includes an arrangement which develops a biasing voltage for the upper N-channel transistor. The biasing voltage exceeds the magnitude of the power source voltage so that the upper N-channel transistor can exhibit low channel ON resistance whereby substantially the entire supply voltage is applied to a load device. A transistor switch becomes conductive across a resistance which couples biasing voltage to the upper N-channel transistor when the biasing voltage exceeds the supply voltage.

8 Claims, 2 Drawing Figures

POWER AMPLIFIER CIRCUIT EMPLOYING FIELD-EFFECT POWER TRANSISTORS

This invention relates to power amplifier circuits and in particular to power amplifier circuits employing field-effect power transistors.

Power amplifiers are often called upon to supply substantial power to low impedance loads with high efficiency. Satisfying this call becomes more difficult where the available power source is of low voltage, as is the case in a radio operating from an automotive 12-volt power source. The difficulty is increased by the desire to employ amplifier circuits which have high reliability and which are low in cost.

To obtain high efficiency, it is necessary that the portion of the supply voltage applied to the load, e.g. a loudspeaker in an automotive radio, be maximized. In other words, the voltage loss across the amplifying transistors must be minimized. With bipolar transistors, this is accomplished by driving the transistors to saturation whereby minimum collector-to-emitter saturation voltages of less than one volt can be realized. Much of the benefit obtained from low saturation voltage is lost, however, due to the high base current (typically one-tenth of the collector current) required to realize the low saturation voltage. Darlington-connected bipolar transistors can be employed to reduce the required level of base current, however, these transistors also sacrifice efficiency because they exhibit higher saturation voltages (typically one to two volts).

On the other hand, field-effect power transistors (FETs) have recently become available which exhibit channel ON resistances which are sufficiently low (less than one ohm) so as to develop minimum voltage drops which are comparable to the low saturation voltages of bipolar transistors. These power FETs exhibit extremely high gate impedances (e.g. over one megohm) so as to require insignificant drive current thereby avoiding the problem of high drive current inherent in bipolar transistors.

Further efficiency improvement obtains when a class D power amplifier circuit is employed. In a class D amplifier circuit, the load receives maximum and minimum voltages alternately at a switching frequency substantially greater than, but at least two times, the highest signal frequency of interest. Signal information is represented by the instantaneous average value of the switching frequency waveform which is controlled by varying the relative times at which the maximum and minimum voltages are applied. This technique is known in the art as duty-factor control, pulse-duration modulation or pulse-width modulation (PWM) in which the information is represented by the ratio of the pulse duration to the pulse period.

Ideally, a class D amplifier circuit would employ a P-channel power FET and an N-channel power FET in complementary push-pull connection. In this arrangement, the same drive signal can be applied directly to the gates of both FETs. This is not always practical, however, because the performance of commercially available N-channel power FETs is more advanced than that of P-channel power FETs. Thus, P-channel FETs which have performance comparable to available N-channel FETs may not be available. In addition, where P-channel and N-channel power FETs of comparable performance are available, the P-channel power FET is substantially more expensive than the N-channel power FET. Thus, it is desirable to employ two N-channel power FETs in quasi-complementary push-pull amplifier connection so as to avoid the extra cost of a P-channel power FET.

Since power FETs are enhancement-mode devices, it is necessary that substantial voltages be applied between their gate and source electrodes to achieve the low channel ON resistance required for an efficient class D amplifier circuit. Presently available N-channel power FETs require about 5-10 volts gate-source voltage to achieve minimum channel ON resistance. In a single power source environment such as is the case in an automobile radio, a gate bias voltage in excess of the available power source voltage is required.

To provide the gate voltage necessary to achieve efficient class D operation, the present invention comprises first and second field-effect transistors of like channel conductivity having respective channels coupled in series between first and second terminals and receiving signals in inverted sense at their respective gate electrodes. A biasing voltage developed with respect to the drain and source electrode voltages of the first transistor is coupled by a resistance to the gate electrode thereof. A switch completes a conductive path across the resistance when the bias voltage exceeds the potential at the first terminal.

In the drawing

FIG. 1 is a schematic diagram of an amplifier arrangement including the present invention; and FIG. 2 is a representation of a signal waveform useful in understanding the operation of the arrangement of FIG. 1.

In the amplifier circuit arrangement of FIG. 1, input signals received from driver source 10 at input terminal IN are amplified and supplied via output terminal OUT to a load LS. Load LS is, for example, a loudspeaker of a radio receiver.

Driver source 10 provides a signal of the sort shown by the solid lines in FIG. 2. The information contained in the signal is represented by waveform 100 (shown in phantom). The drive signal includes a series of pulses having a period P (i.e. a pulse repetition rate of 1/P) in which the information is represented by the width W of each pulse. For example, a low information level is represented by relatively narrow pulses 102 and 106 in which the ratio W/P is a small fraction (i.e. approaches zero) whereas a high level is represented by a relatively wide pulse 104 of which the ratio W/P is a large fraction (i.e. approaches unity). Driver 10 can be satisfactorily implemented with paralleled outputs from a CD4049 COS/MOS hex buffer/converter or from a CA3600 COS/MOS transistor array commercially available from RCA Corporation, Solid State Division, Somerville, N.J.

The waveform at terminal OUT is an amplified and inverted version of the FIG. 2 waveform. In a radio with digital audio signal processing, for example, the pulse repetition rate 1/P of 50-70 kiloHertz is satisfactory for audio programming having a 15 kiloHertz audio bandwidth. Since the loudspeaker LS cannot follow the pulse waveform due to the filtering caused by its coil inductance and mechanical inertia, the reproduced sound tends to follow waveform 100. Thus, loudspeaker LS tends to serve as a low-pass filter, at least up to its frequency response limit. In addition, because the human ear is incapable of responding to signals at the 1/P switching frequency, application of signals at such frequencies will not be deleterious to the perceived quality of the reproduced audio programming.

A low-pass filter (not shown) can be interposed between terminal OUT and load LS where the inductance of LS is too low to provide sufficient low-pass filtering or where it is desired to reduce the magnitude of high frequency signals applied to LS. So that no power loss will result, the low-pass filter comprises reactive elements. For example, a satisfactory low-pass filter includes an inductance interposed in series with the loudspeaker LS and a capacitance connected in parallel with loudspeaer LS. The values of inductance and capacitance are selected so as to minimally attenuate the audio programming signals (0–15 KH$_z$) while substantially attenuating the signals at the switching frequency (50–70 KH$_z$).

N-channel field-effect power transistors N1 and N2 have their channels (drain-source conduction paths) connected in series between supply voltage terminal $V_{cc}$ and ground G. Voltage $V_{cc}$ is nominally +14 volts in an automotive 12-volt electrical system but ranges between about 10 to 16 volts.

N1 receives inverted drive signal from terminal IN via inverting amplifier 20. Drive signal is coupled to the base of inverting NPN transistor T1 by a voltage divider including resistors R3 and R4 and capacitor C2. Inverted drive signals at the collector of T1 are applied to the gate of N1. N2 receives drive signals from terminal IN via a voltage divider including resistors R1 and R2 and capacitor C1. This connection of N1 and N2 comprises a quasi-complementary, push-pull amplifier connection.

Power FETs N1 and N2 include parasitic diodes DN1 and DN2 (shown in phantom), respectively, by reason of their semiconductor structure. DN1 and DN2 desirably serve as "catch" diodes to conduct currents tending to continue to flow due to the inductance of load LS at times when N1 and N2 are not conductive. DN1 and DN2 thus provide paths for current flow to supply $V_{cc}$ and ground G thereby reducing the generation of voltage transients at terminal OUT.

Since N1 and N2 are enhancement-mode devices, the drive signal magnitude is at least 8–10 volts to ensure sufficient gate voltage to cause N1 and N2 to exhibit low respective channel ON resistances during respective times when each is conductive. Capacitors C1 and C2 are speed-up capacitors provided so that the rise and fall times of the gate voltage signals of N1 and N2 are not degraded by their parasitic gate-to-source capacitances (not shown).

When the signal at terminal IN is high (e.g. 8–10 volts during pulse width W), N2 is conductive and, because transistor T1 is conductive, N1 is non-conductive. Thus, terminal OUT is substantially at ground G potential because N2 exhibits low channel ON resistance. Bias developing arrangement 30, connected between the drain and source of N1, receives substantially the $+V_{cc}$ voltage during this condition. Because the drain voltage of N1 is relatively positive with respect to its source voltage, diode D1 is forward biased and conducts current to charge voltage storage capacitor C3. C3 is charged to $V_{cc}$ voltage less the forward drop of D1 less the drain-source ON voltage drop of FET N2, e.g. C3 charges to 10–13 volts.

When the signal at terminal IN becomes low (e.g. about 0 volts during portions of period P other than during pulse width W), N2 is non-conductive and the voltage at terminal OUT tends to rise toward $V_{cc}$. Because transistor T1 is non-conductive, the bias voltage at the positive plate of capacitor C3 is applied to the gate of FET N1 via resistance R5. This causes N1 to become conductive and exhibit decreasing drain-source voltage drop whereby the voltage at terminal OUT approaches $V_{cc}$.

Since the negative plate of capacitor C3 is connected to the source of N1, its gate voltage is maintained positive with respect to its source by the 10–13 volt biasing voltage stored on C3. Thus, the gate of N1 is driven sufficiently positive to enable it to exhibit low channel ON resistance so that the voltage at terminal OUT is substantially $V_{cc}$. It is noted that diode D1 becomes reverse biased at times when FED N1 is conductive and does not provide a path for discharge current from C3. Since the gate-input resistance of FET N1 is also very high, it does not provide a path for discharge current from C3. In addition, C3 is selected to have a large capacitance so that the biasing voltage does not decrease appreciably during the times when N1 is conductive. Thus, N1 can remain conductive even when the information signal is such that a large number of pulses having width W approximately equal to period P occur. In other words, biasing arrangement 30 develops a substantially direct current biasing voltage for the gate of N1.

Therefore, the amplifier circuit of FIG. 1 provides high efficiency because FETs N1 and N2 both exhibit low channel ON resistances so that substantially the full power source voltage $V_{cc}$ is applied to loudspeaker LS, and further because neither N1 nor N2 requires significant base drive current.

Improvement of amplifier efficiency is also served by decreasing the rise time of the signal at terminal OUT, as is provided by pull-up arrangement 40 modifying biasing arrangement 30. Pull-up PNP transistor T2 receives potential $V_{cc}$ at its base through resistor R6 and the bias voltage from the positive plate of C3 at its emitter. The collector-emitter conduction path of T2 is in parallel with resistor R5. At times when N1 is off and N2 is on, the base-emitter of T2 is reverse biased and T2 is non-conductive.

When N1 is turning on and N2 turning off, the voltage at the gate of N1 is rising owing to T1 becoming non-conductive and bias potential being applied from C3 via resistor R5. This rise is slowed by the parasitic capacitance (not shown) exhibited at the gate of N1. In addition, the voltage at terminal OUT is rising. In a short time the sum of the voltage at terminal OUT and the bias voltage stored by capacitor C3 exceeds the power source voltage $V_{cc}$ by the base-emitter threshold voltage of T2. At that time, the base-emitter of T2 becomes forward biased causing its collector-emitter path to become conductive. Thus, the positive plate of C3 is coupled to the gate of N1 by the low resistance path provided by T2 becoming conductive, thereby rapidly charging the gate capacitance of N1 to substantially shorten the time required to apply full gate voltage to N1 and thereby to substantially shorten rise time of the signal at terminal OUT.

Even though the turn-on and turn-off times exhibited by power FETs N1 and N2 are very short, there exists a short period during the transitions in which N1 and N2 may both be conductive. This can cause increased power consumption and decreased efficiency because current can be conducted directly from terminal $V_{cc}$ to ground G via the channels of N1 and N2 without passing through load LS. Pull-down arrangement 50 improves efficiency by preventing significant current flow of the sort just described.

To this end, the collector-emitter path of NPN transistor T3 couples the gate of FET N2 to its source at ground G whenever the gate voltage of FET N1 rises beyond a predetermined voltage with respect to the source voltage of FET N2. The predetermined voltage is determined by the ratio of the voltage divider including resistors R7 and R8 and the base-emitter threshold voltage $V_{be}$ of T3. Speed-up capacitor C4 tends to overcome any delay which might be introduced by capacitance at the base of T3.

Modifications to the above-described embodiment are contemplated and the scope of the present invention should be limited only by the claims following. For example, the push-pull connection of N1 and N2 specifically described herein can be employed in a full-bridge amplifier arrangement or in a half-bridge amplifier arrangement. In the former, signals from terminal OUT are applied via connection 62 (shown in phantom) to the input of inverting amplifier 60 which has a voltage gain of minus unity. The inverted signals at the output of amplifier 60 are applied to the other connection of loudspeaker LS.

In a half-bridge arrangement, two capacitors (not shown) having substantially equal and large capacitances are connected in series between terminal $V_{cc}$ and ground G. The other connection of loudspeaker LS is connected to the interconnection between these two capacitances at which point the voltage is substantially $V_{cc}/2$.

If load LS is connected between terminal OUT and ground G, then a blocking capacitance must be connected in series with LS to prevent the flow of direct current therethrough.

By way of further example, inverter 20, pull-up arrangement 40, pull-down arrangement 50, and diode D1 and resistor R5 of biasing arrangement 30, or their equivalents, can be fabricated on a COS/MOS integrated circuit along with driver source 10 and other portions of, for example, a radio receiver. It is anticipated that FETs N1 and N2 be discrete transistors since they would require very large areas on an integrated circuit to obtain low channel ON resistances. Inclusion of C3 on an integrated circuit is not practical also due to the excessively large area which would be required.

What is claimed is:

1. Amplifying apparatus comprising:
   first and second terminals for receiving operating potential therebetween;
   input and output terminals for receiving and supplying respective time-varying signals;
   first and second field-effect transistors of like channel conductivity, each having a conductive channel between its drain and source electrodes and each having a gate electrode;
   means for coupling the drain and source electrodes of said first transistor to said first and output terminals, respectively;
   means for coupling the drain and source electrodes of said second transistor to said output and second terminals, respectively;
   means for applying the time-varying signals received at said input terminal to the respective gate electrodes of said first and second transistors including means for inverting the sense of the time-varying signal applied to the gate electrode of one of said first and second transistors with respect to the sense of the time-varying signal applied to the gate electrode of the other of said first and second transistors;
   biasing means responsive to the voltages at the drain and source electrodes of said first transistor for developing a substantially direct current biasing voltage with respect to the voltage at the source electrode of said first transistor; and
   means for applying said biasing voltage to the gate electrode of said first transistor including a resistance for coupling said biasing voltage to the gate electrode of said first transistor and switching means coupled across said resistance for completing a conductive connection thereacross responsive to said biasing voltage exceeding the potential at said first terminal.

2. The apparatus of claim 1 wherein said biasing means comprises second switching means and voltage storing means in series connection between the drain and source electrodes of said first transistor, said second switching means being rendered respectively conductive and non-conductive in response to the voltage between the drain and source electrodes of said first transistor exceeding and not exceeding the voltage stored by said voltage storing means.

3. The apparatus of claim 2 wherein said resistance is connected between the gate electrode of said first transistor and the interconnection of said second switching means and said voltage storing means.

4. The apparatus of claim 2 or 3 wherein said second switching means includes a diode.

5. The apparatus of claim 2 or 3 wherein said voltage storing means includes a capacitance.

6. The apparatus of claim 1 wherein said switching means includes a transistor having a common electrode to which said biasing voltage is coupled, an output electrode coupled to the gate electrode of said first transistor and an input electrode coupled to said first terminal.

7. The apparatus of claim 1 further comprising means for decreasing the voltage at the gate electrode of said second transistor responsive to the voltage at the gate electrode of said first transistor exceeding a predetermined voltage with respect to the voltage of the source electrode of said second transistor.

8. The apparatus of claim 7 wherein said means for decreasing includes a transistor having output and common electrodes respectively coupled to the gate and source electrodes of said second transistor, and having an input electrode to which the voltage at the gate electrode of said first transistor is coupled.

* * * * *